United States Patent [19]
Okada et al.

[11] Patent Number: 5,213,984
[45] Date of Patent: May 25, 1993

[54] METHOD OF MANUFACTURING AN IMAGE SENSOR

[75] Inventors: Junji Okada; Hiroshi Fujimagari, both of Kanagawa, Japan

[73] Assignee: Fuji Xerox Co., Ltd., Tokyo, Japan

[21] Appl. No.: 774,956

[22] Filed: Oct. 11, 1991

[30] Foreign Application Priority Data

Oct. 18, 1990 [JP] Japan .................. 2-277815

[51] Int. Cl.$^5$ .................................. H01L 31/20
[52] U.S. Cl. ........................ 437/2; 437/101; 437/196; 156/653
[58] Field of Search ........ 437/2, 3, 101, 192, 437/196, 228; 148/DIG. 1, DIG. 150; 156/653, 663

[56] References Cited

U.S. PATENT DOCUMENTS 4,997,773 3/1991 Nobue et al. ................ 437/2
5,075,237 12/1991 Wu ................................ 437/2
5,075,244 12/1991 Sakai et al. .................. 437/101

FOREIGN PATENT DOCUMENTS 58-56363 4/1983 Japan .
0147070 9/1983 Japan ...................... 437/101

Primary Examiner—Brian E. Hearn
Assistant Examiner—C. Chaudhari
Attorney, Agent, or Firm—Finnegan, Henderson, Farabow, Garrett & Dunner

[57] ABSTRACT

A metal film and a doped a-Si film are deposited on a glass substrate, and successively etched by photolithography using the same resist pattern, to form a metal electrode and doped a-Si layers. The doped a-Si layers thus formed are then re-etched to remove portions protruding from the metal electrode. Then, a non-doped a-Si layer and a transparent electrode are successively formed on the doped a-Si layer. A protection film may additionally be deposited on the glass substrate before the deposition of the metal film.

6 Claims, 9 Drawing Sheets

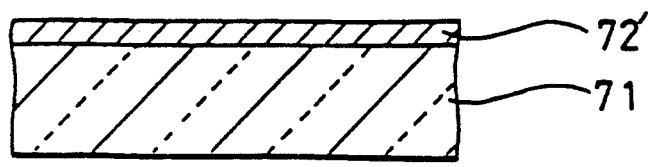
FIG. 6 (a) PRIOR ART
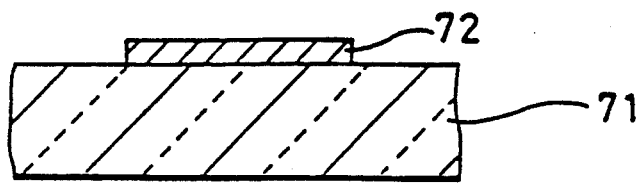
FIG. 6 (b) PRIOR ART
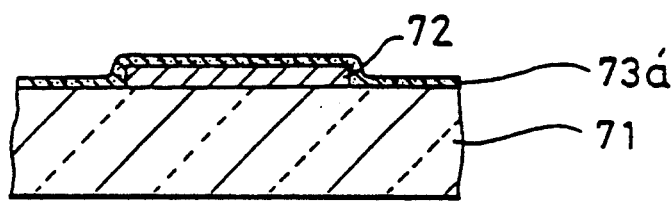
FIG. 6 (c) PRIOR ART
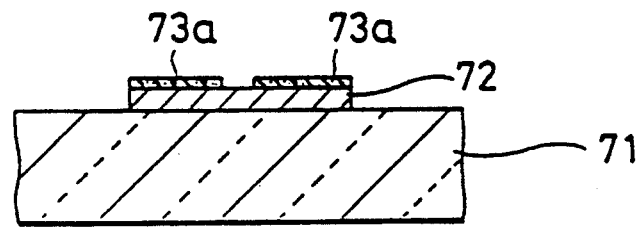
FIG. 6 (d) PRIOR ART
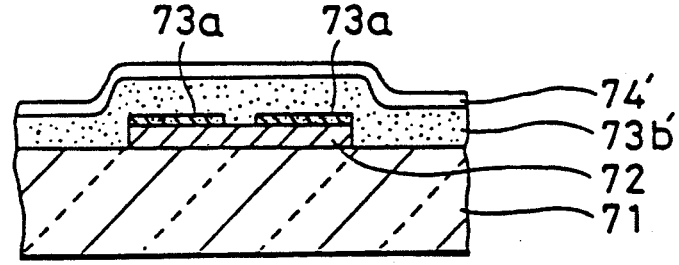
FIG. 6 (e) PRIOR ART

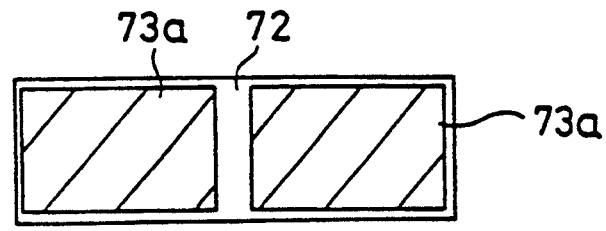
FIG. 9 (C) PRIOR ART
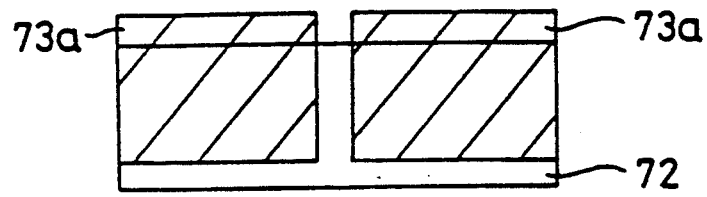
FIG. 9 (a) PRIOR ART
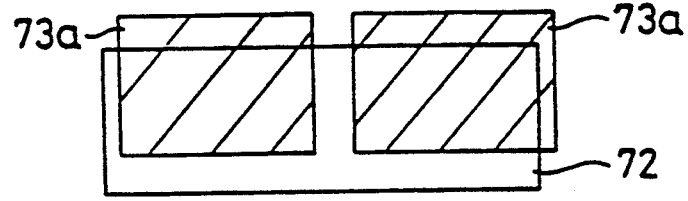
FIG. 9 (b) PRIOR ART

METHOD OF MANUFACTURING AN IMAGE SENSOR

BACKGROUND OF THE INVENTION

The present invention relates to an image sensor for use in an input section of a facsimile machine, etc. More particularly, it is directed to a manufacturing method of an image sensor in which light-receiving elements of a thin-film lamination structure are separated bit-by-bit. For instance, an image sensor in which a plurality of light-receiving elements are arranged in line with each light-receiving element consisting of a photodiode and a blocking diode connected back-to-back.

FIG. 7 shows an example of a conventional image sensor used in a facsimile machine, etc. to read images. A single light-receiving element 70 consists of a photodiode PD1 and a photodiode PD2 functioning as a blocking diode which are connected back-to-back. A plurality of such light-receiving elements 70 are arranged in line. The photodiodes PD1 and PD2 have a thin-film sandwiched structure in which a lower electrode (metal electrode) 72, a photoelectric conversion layer (a-Si (amorphous silicon) layer) 73 and an upper electrode (transparent electrode) 74 are sequentially formed on a substrate 71.

Referring to FIG. 8, a method of reading out signals from the above image sensor will be described below.

The photodiodes PD1 are scanned by a shift register SR so that pulses are sequentially applied thereto, and an electric charge is stored in each of the reverse-biased photodiodes PD1. If light is incident on a certain photodiode PD1 during one scan, an electric charge corresponding to the amount of incident light is discharged. Then, read pulses are sequentially applied from the shift resister SR to the photodiodes PD1, so that a charge corresponding to the discharge amount is stored again in the photodiode PD1. Image signals from the respective photodiodes PD1 are sequentially extracted by reading out a current produced by this re-charging via a read circuit 80. (refer to Japanese Patent Application Unexamined Publication No. Sho. 58-56363).

Since the photodiodes PD2 serve as switching diodes in the above reading method, it is preferred that they have a structure which allows a large forward current. It is thus more effective to provide an ohmic contact structure in which a doped a-Si layer 73a (see FIG. 7) is interposed between the metal electrode 72 and a non-doped a-Si layer 73b, rather than a Schottky structure in which the metal electrode 72 is in contact with a non-doped a-Si layer.

To provide such an ohmic contact structure, a conventional method involves the steps of depositing a metal film such as chromium (Cr) on the entire surface of the substrate 71; patterning the metal film by photolithography to form the lower electrode 72; depositing a doped a-Si film and a non-doped a-Si film sequentially; and patterning these deposited films by photolithography so as to form the doped a-Si layer 73a and the non-doped a-Si layer 73b.

However, according to this conventional manufacturing method, the doped a-Si layer 73a and the non-doped a-Si layer 73b are shaped into the same pattern as shown in FIG. 7. As a result, the doped a-Si layer 73a extends outside the area used for the photoelectric conversion. This outside area provides a large capacitance, resulting in a reduction of the detected output signal.

To make the size of the doped a-Si layer equal to that of the lower electrode 72, a method as shown in FIGS. 6(a)–6(g) has been proposed in which the following steps are sequentially performed. First, a chromium film 72' is deposited on a substrate 71 (FIG. 6(a)); the chromium film 72' is patterned to form a lower electrode 72 (FIG. 6(b)); a doped a-Si film 73a' is deposited (FIG. 6(c)); the doped a-Si film 73a' is patterned to form a doped a-Si layer 73a (FIG. 6(d)); a non-doped a-Si film 73b, and an indium tin oxide (ITO) film 74' are deposited (FIG. 6(e)); the non-doped a-Si film 73b, and the ITO film 74, are patterned to form a non-doped a-Si layer 73b and a transparent electrode 74 (FIG. 6(f)); and an insulating layer 75 is deposited and patterned, and a wiring metal film 76 is deposited and patterned (FIG. 6(g)).

However, even in this method, since the lower electrode 72 and the doped a-Si layer 73a are patterned by forming resist patterns by use of different masks, it may be the case that the lower electrode 72 and the doped a-Si layer 73a fail to have the same width due to mismatching of the masks. As a result, part of the doped a-Si layer 73a will be located outside the lower electrode 72 as shown in FIGS. 9(a) and 9(b), and will form a capacitor. This also causes an undesirable decrease in the detected output signal.

Further, to prevent the doped a-Si layer 73a from being formed outside the lower electrode 72, it may be conceivable to pattern the doped a-Si layer 73a into a smaller area than the lower electrode (FIG. 9(c)). However, this precludes the effective use of the lower electrode 72.

SUMMARY OF THE INVENTION

The present invention has been made in view of the above circumstances. Accordingly, an object of the invention is to provide a method of manufacturing an image sensor having a high sensitivity, which image sensor includes a plurality of light-receiving elements arranged in line with each light-receiving element consisting of two photodiodes connected back-to-back.

According to the invention, a method of manufacturing an image sensor, comprises the steps of depositing a metal film on a substrate, depositing a doped amorphous Si film on the metal film, forming a doped amorphous Si layer and a metal electrode by successively etching the doped amorphous Si film and the metal film by photolithography using a common resist pattern, re-etching the doped amorphous Si layer to remove portions thereof protruding from the metal electrode, depositing a non-doped amorphous Si film to cover the doped amorphous Si layer, depositing a transparent conductive film on the non-doped amorphous Si film, and forming a transparent electrode and a non-doped amorphous Si layer by successively etching the transparent conductive film and the non-doped amorphous Si film by photolithography.

Further, a protection film may additionally be deposited on the substrate before the deposition of the metal film.

BRIEF DESCRIPTION OF THE DRAWINGS

FIGS. 6(a)-6(g) show steps of a conventional manufacturing method of a light-receiving element;

FIGS. 9(a)-9(c) are plan views showing the positional relationships between a metal electrode and a doped a-Si layer of a light-receiving element manufactured by the method of FIGS. 6(a)-6(g).

DESCRIPTION OF THE PREFERRED EMBODIMENTS

Figure 1:
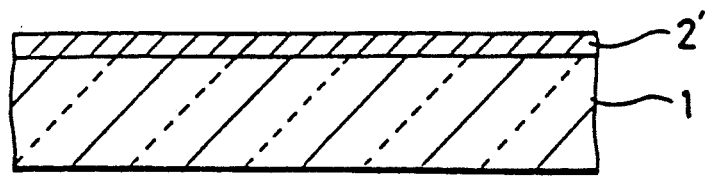
FIGS. 1(a)–1(f) show steps of a manufacturing method of an image sensor according to an embodiment of the present invention.
Figure 1:
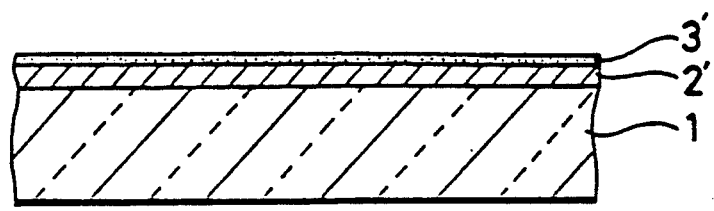
Figure 1:
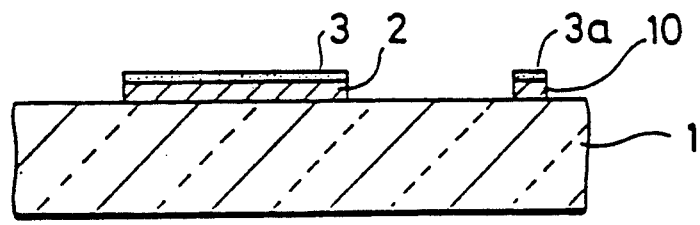
Figure 1:
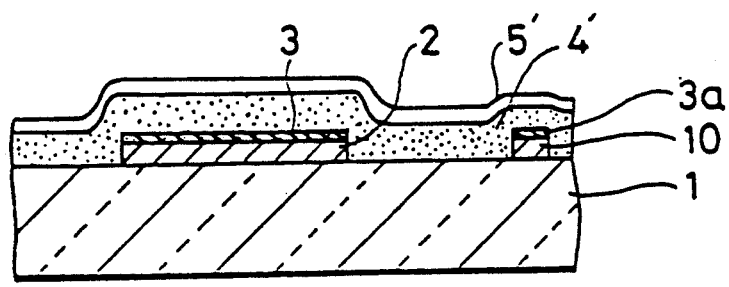
Figure 1E:
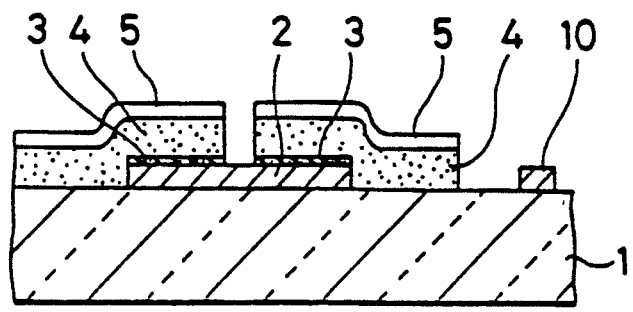

A light-receiving element part of an image sensor manufactured by a method of the invention will be described with reference to FIG. 1(f).

A light-receiving element 70 includes: a glass substrate 1; photodiodes PD1 and PD2, each of which is formed on the glass substrate 1 by sequential deposition and patterning of a metal electrode 2 made, e.g., of chromium (Cr), a doped amorphous silicon (a-Si) layer 3, a non-doped a-Si layer 4, and a transparent electrode 5, i.e., a transparent photoconductive layer made, e.g., of indium tin oxide (ITO); an inter-layer insulating layer 6 made, e.g., of polyimide and covering both the photodiodes PD1 and PD2; contact holes 7 formed in the inter-layer insulating layer 6; and leads 9 connected to the transparent electrodes 5 of the photodiodes PD1 and PD2 through the contact holes 7 and barrier metal layers 8, respectively. The photodiode PD2 is a blocking diode which acts as a switching diode.

The barrier metal layer 8 is formed so as to have the same pattern as the lead 9, and is made of refractory metal e.g., titanium (Ti), titanium nitride (TiN), nickel (Ni), chromium (Cr), tantalum (Ta), molybdenum (Mo), tungsten (W), or an alloy thereof.

The metal electrode 2 of the photodiodes PD1, PD2 is shaped so as to have the same area as the light-receiving area. That is, the metal electrode 2 of the photodiodes PD1, PD2 has the same width as the doped a-Si layer 3 so that the metal electrode 2 does not exist under the leads 9. Further, one of the leads 9 is connected, through the contact hole 7, to a common electrode line 10 which is formed together with the metal electrode 2.

Figure 8:
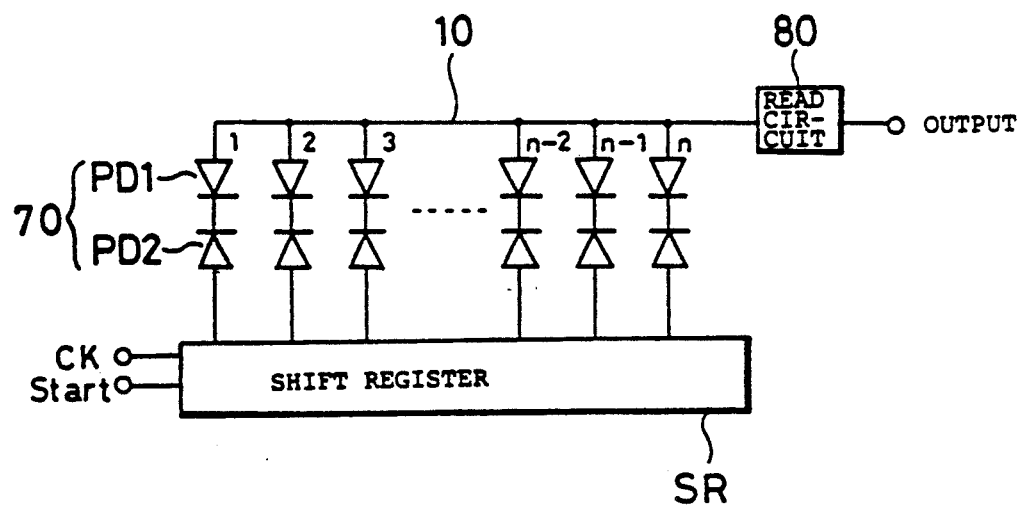
FIG. 8 is a circuit diagram of an image sensor.

A plurality of light-receiving elements 70 having the above structure are arranged in line (see FIG. 8), and each light-receiving element 70 is connected to the common electrode line 10. A read circuit 80 is connected to the end of the common electrode line 10 so that signals are read out bit-by-bit.

A method of manufacturing this light-receiving element 70 will be described with reference to FIGS. 1(a)-1(f).

First, a metal film 2' of, e.g., Cr, Ti or Ta is deposited on a glass substrate 1 by vapor deposition or sputtering to a thickness of about 700 Å, as shown in FIG. 1(a).

Then, a doped a-Si film n- or p-type) 3' is deposited by plasma chemical vapor deposition (P-CVD), as shown in FIG. 1(b). To deposit the n-type a-Si film 3', a gas is used in which 1% phosphine ($PH_3$) is added to a 100% silane ($SiH_4$) gas. For the p-type film, a gas is used in which 1% diborane ($B_2H_6$) is added to a 100% silane ($SiH_4$) gas. The deposition temperature is set at 180°–300° C., while the film thickness about 1,000 Å or less.

A resist pattern (not shown) is formed on the doped a-Si film 3, by photolithography, and then the doped a-Si film 3' is patterned by dry-etching or wet-etching to form doped a-Si layers 3. The dry-etching is performed in an atmosphere including a gas such as $CF_4$, $SF_6$, $C_2ClF_5$ either singly or ni mixture. The wet-etching is performed in a mixed solution of hydrofluoric acid and ammonium fluoride. Since the above resist pattern has such a shape as to be also used to pattern the metal film 2' (Cr, etc.), a doped a-Si layer 3a remains also on the area in which a common electrode line 10 will be formed in the next step.

Figure 3:
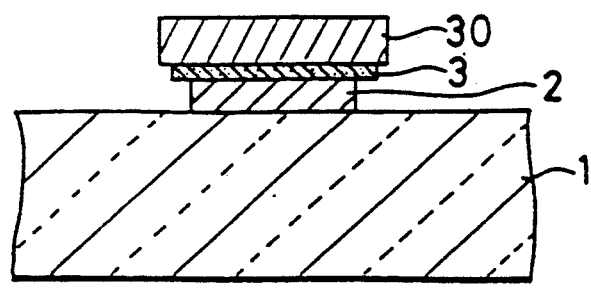
FIG. 3 is a sectional view used for explaining why re-etching of a doped a-Si layer is required.

Successively, as shown in FIG. 1(c), the metal film 2' (Cr or the like) is patterned by wet-etching in, e.g., a mixed solution of cerium nitrate and perchloric acid (in the case of Cr) to form the common electrode line 10 and a metal electrode 2 which will serve as the lower electrode of the photodiodes PD1, PD2. In this step, since the metal electrode 2 is subjected to side-etching to a large extent, it results that the doped a-Si layers 3 protrude from the metal electrode 2 as shown in FIG. 3. In FIG. 3, reference numeral 30 designates the resist pattern. If subsequent processes are performed with the doped a-Si layers 3 as they are, voids will be formed in the vicinity of the metal electrode 2, and will cause the layers to peel off or break transparent electrodes 5 (described later) formed thereon. To remove the protruded portions of the doped a-Si layers 3, the doped a-Si layers 3 are re-etched using the etching solution similar to the one described above.

Figure 4:
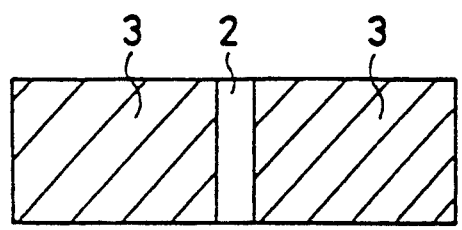
FIG. 4 is a plan view showing the positional relationship between a metal electrode and the doped a-Si layer in the methods of the invention.

After performance of this step, the metal electrode 2 and the doped a-Si layers 3 have the same width as shown in FIG. 4. As a result, not only can deterioration of the photodiodes be prevented, but also their capacitance can be decreased. In addition, the metal electrode 2 is formed so as to have the same area as the light-receiving area of the photodiodes PD1, PD2. The area of the metal electrode 2 other than the area necessary for providing a sufficient forward current for driving a sensor element is made as small as possible to prevent the formation of an undesirable capacitance.

Then, a non-doped a-Si film 4' is deposited to a thickness of 0.5-2 μm over the entire surface by P-CVD at 180°–300° C.

Thereafter, as shown in FIG. 1(d), an ITO film 5' is deposited over the entire surface to a thickness of about 800 Å by sputtering.

A resist pattern (not shown) is formed on the ITO film 5' by photolithography, and the ITO film 5' is then etched using a mixed solution of hydrochloric acid and nitric acid to form the transparent electrodes 5. Successively, the non-doped a-Si film 4' is patterned by dry-etching or wet-etching to form non-doped a-Si layers 4. The dry-etching is performed in an atmosphere including a gas such as $CF_4$, SFand $C_2ClF_5$ singly or in mixture. The wet-etching is performed in a mixed solution of hydrofluoric acid and ammonium fluoride. The doped a-Si layer 3a remaining on the common electrode line 10 can be removed during this etching step.

Then, polyimide (PIX-1400 or PIX-8803 manufactured by Hitachi Chemical Co., Ltd., "Photoniece" manufactured by Toray Industries, Inc., or the like) is applied to a thickness of about 1 μm to form an inter-layer insulating film 6, and contact holes 7 are formed at desired locations. More specifically, the contact holes 7 for the photodiodes PD1, PD2 are formed at positions other than the area of the sandwiched structure consisting of the metal electrode 2, the doped a-Si layers 3, the non-doped a-Si layers 4 and the transparent electrodes 5. This is to keep the diode portions unaffected even if metal of a wiring material is diffused into the ITO transparent electrodes 5 at the time of its deposition by sputtering or vapor deposition (described later), to thereby prevent the deterioration of the diodes (increase of a leak current).

Then, a barrier metal film (Ti, TiN, Ni, Cr, Ta, Mo, W or an alloy thereof) serving as the wiring material is deposited to a thickness of about 500 Å by sputtering or vapor deposition. The barrier metal film is provided to decrease the contact resistance between the ITO transparent electrodes 5 and the wiring material (Al).

Figure 1F:
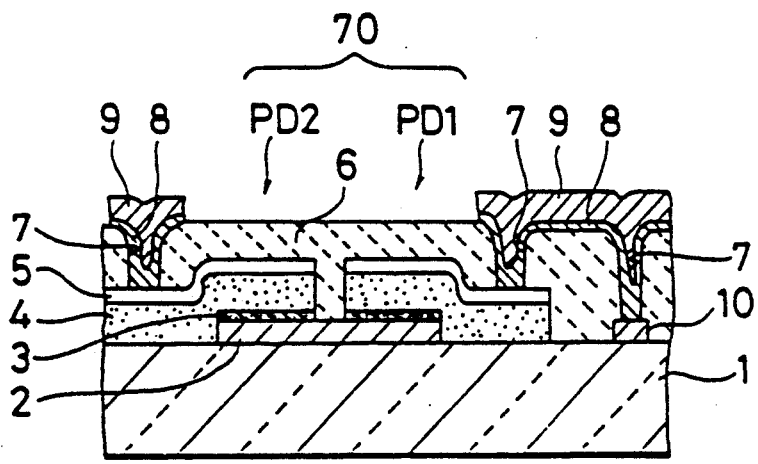

After deposition of the barrier metal film, the wiring material (Al) is deposited by sputtering or vapor deposition; a resist pattern (not shown) is formed by photolithography using a single mask; the wiring material (Al) is etched in a mixed solution of phosphoric acid, nitric acid and acetic acid; and the barrier metal film is etched to form leads 9 and the barrier metal layers 8, as shown in FIG. 1(f). If the barrier metal film is made of Mo, the same solution as for the wiring material (Al) can be used, contributing to simplifying the process.

Figure 5:
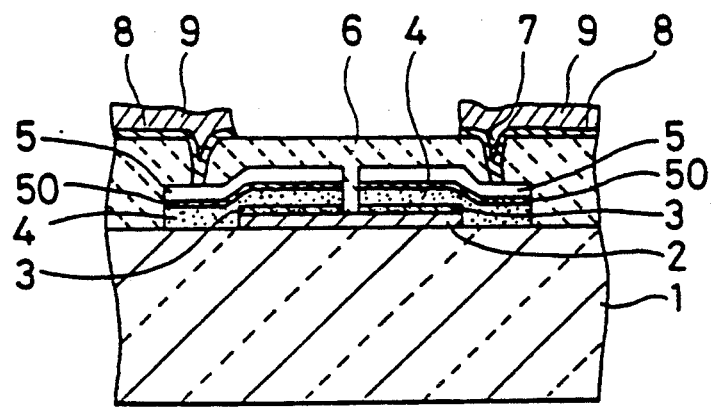
FIG. 5 is a sectional view showing another structure of a light-receiving element.
Figure 6F:
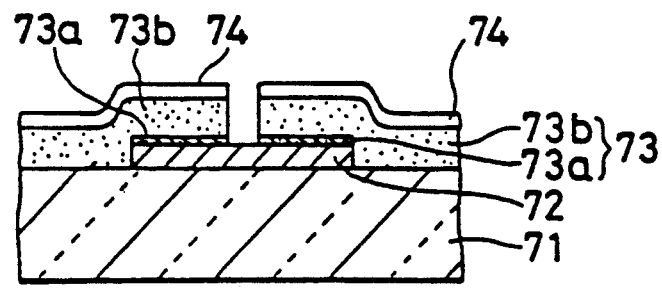
Figure 6G:
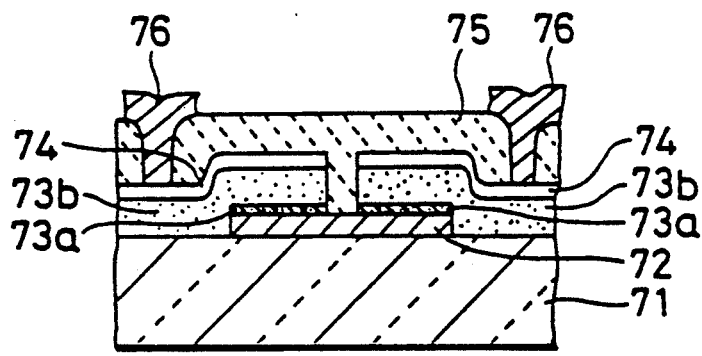
Figure 7:
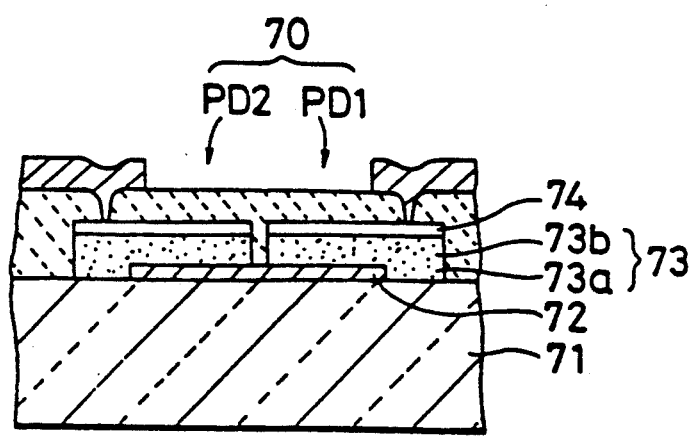
FIG. 7 is a sectional view showing a conventional light-receiving element.

While in the above embodiment the doped a-Si layers 3 are formed on the side of the metal electrode 2 to form an ohmic contact only on a single side, doped a-Si layers 50 may additionally be formed on the side of the transparent electrodes 5 to provide an ohmic contact, as shown in FIG. 5. To this end, another doped a-Si film is deposited by P-CVD in succession to the deposition of the non-doped a-Si film. and is etched simultaneously with the etching of the non-doped a-Si film.

FIGS. 2(a)-2(g) show a manufacturing method according to a second embodiment of the invention.

Figure 2:
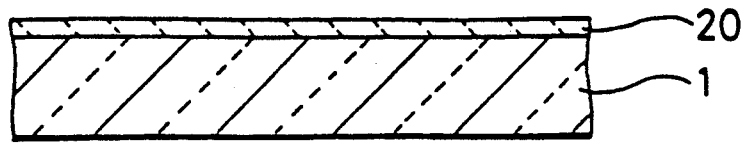
FIGS. 2(a)–2(g) show steps of a manufacturing method of an image sensor according to a second embodiment of the invention.
Figure 2:
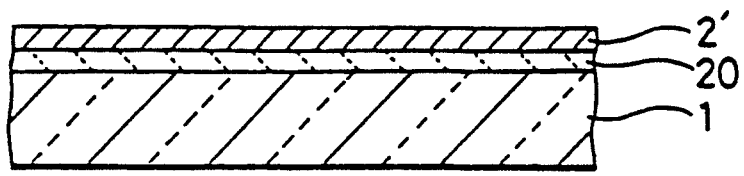
Figure 2:
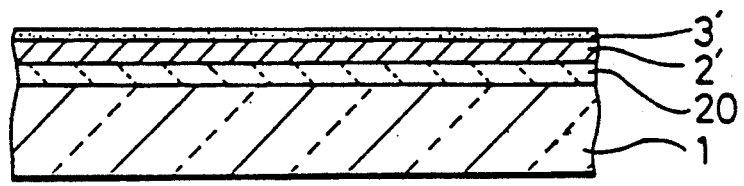
Figure 2:
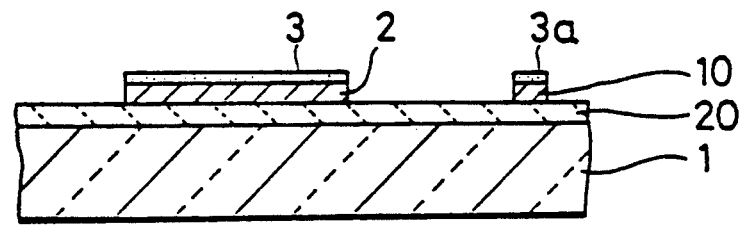
Figure 2:
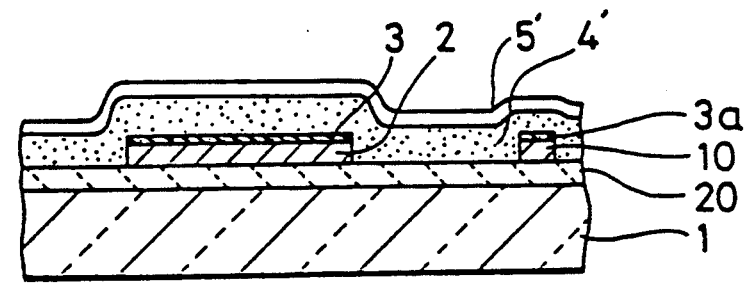
Figure 2:
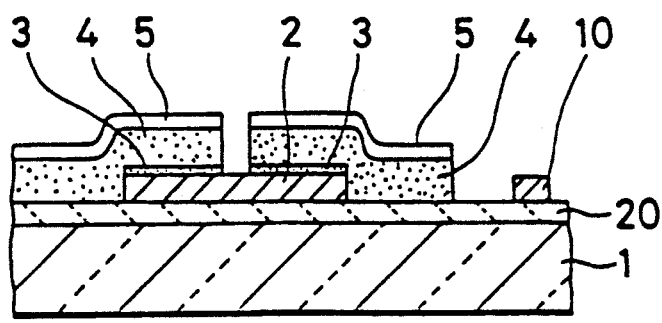
Figure 2:
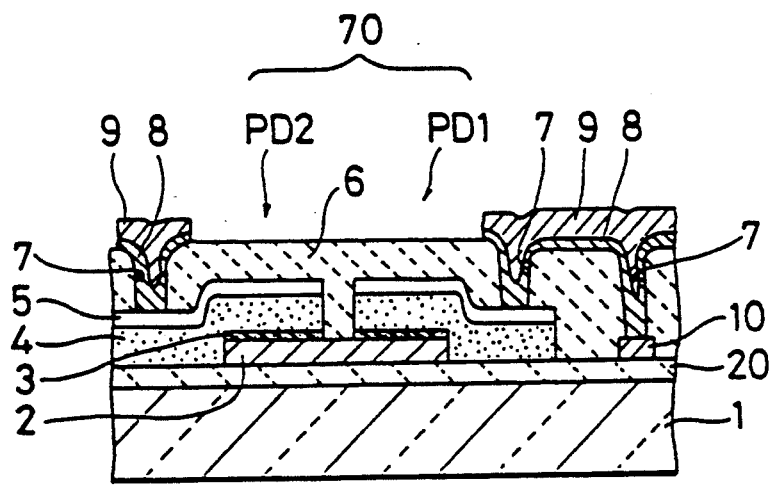

The method of FIGS. 1(a)-1(f) has a problem that during the re-etching of the doped a-Si layers 3, the etching solution may damage the underlying glass substrate 1 (for instance, the glass substrate 1 is etched), and this may impair reliability of produced image sensors or their production yield. In the second embodiment, a silicon nitride ($SiN_x$) film is deposited to a thickness of about 3,000 Å b y P-CVD or sputtering to form a protection film 20, as shown in FIG. 2(a).

Thereafter, a metal film 2' is deposited; a doped a-Si film 3' is further deposited; and the subsequent steps are performed. Since the subsequent steps are similar to those shown in FIGS. 1(c)-1(f), detailed description therefor will be omitted. In FIG. 2(a)-2(g), the same parts as those in FIGS. 1(a)-1(f) are designated by the same numerals.

In the second embodiment, the protection film 20 may be made of an organic film of polyimide, instead of $SiN_x$.

According to the invention, the metal film and the doped a-Si film are continuously etched by photolithography using the same mask, and the resultant doped a-Si layers a then re-etched. Therefore, the metal electrode and the doped a-Si layers can be formed so as to have the same width, thereby allowing the production of image sensors having a high sensitivity.

Further, where the protection film is formed under the metal electrode, the substrate is prevented from being damaged when the doped a-Si layers are re-etched, thereby contributing to improving reliability of produced image sensors and their manufacturing yield.

What is claimed is:

1. A method of manufacturing an image sensor, comprising the steps of:
   depositing a metal film on a substrate;
   depositing a doped amorphous Si film on the metal film;
   forming a resist pattern on said doped amorphous Si film;
   forming a doped amorphous Si layer and a metal electrode by successively etching the doped amorphous Si film with a first etching agent and the metal film with a second etching agent b photolithography using said resist pattern;
   re-etching the doped amorphous Si layer to remove portions of said doped amorphous Si layer protruding from the metal electrode, said protruding portions caused by side-etching of said metal film during said step of successively etching said doped amorphous Si film and said metal film;
   depositing a non-doped amorphous Si film to cover the doped amorphous Si layer;
   depositing a transparent conductive film on the non-doped amorphous Si film; and
   forming a transparent electrode and a non-doped amorphous Si layer by successively etching the transparent conductive film and the non-doped amorphous Si film by photolithography.

2. The method according to claim 1, further comprising, before the metal film depositing step, the step of depositing a protection film on the substrate.

3. The method according to claim 1, wherein a sandwiched structure of the metal electrode, the doped amorphous Si layer, the non-doped amorphous Si layer and the transparent electrode forms two photodiodes having a back-to-back connection, one of the two photodiodes being a blocking diode.

4. The method according to claim 1, wherein the substrate is made of glass.

5. The method according to claim 2, wherein the protection film is made of silicon nitride.

6. The method according to claim 2, wherein the protection film is made of polyimide.

* * * * *